United States Patent [19]
Krenik et al.

[11] Patent Number: 5,596,583
[45] Date of Patent: Jan. 21, 1997

[54] TEST CIRCUITRY, SYSTEMS AND METHODS

[75] Inventors: William R. Krenik, Garland; Louis J. Izzi, Plano; Chenwei J. Yin, Richardson, all of Tex.

[73] Assignee: Texas Instruments Incorporated, Dallas, Tex.

[21] Appl. No.: 734,344

[22] Filed: Jul. 19, 1991

[51] Int. Cl.$^6$ .................................................. G01R 31/28
[52] U.S. Cl. ............................................................ 371/22.1
[58] Field of Search .......................... 371/15.1, 23, 22.1, 371/16.1, 16.2, 68.1

[56] References Cited

U.S. PATENT DOCUMENTS

| | | | |
|---|---|---|---|
| 4,769,632 | 9/1988 | Work et al. | 340/701 |
| 4,815,033 | 3/1989 | Harris | 364/900 |
| 4,831,623 | 5/1989 | Terzian | 371/22.1 |
| 5,003,256 | 3/1991 | Merrill | 371/22.1 X |
| 5,017,809 | 5/1991 | Turner | 371/22.1 X |
| 5,084,874 | 1/1992 | Whetsel, Jr. | 371/25.1 X |
| 5,093,910 | 3/1992 | Tulpule et al. | 364/900 X |

OTHER PUBLICATIONS

Texas Instruments Incorporated "TMS340 70–20 Color Palette", Production Data, 1986 pp. 1–15.
Brooktree "BT459" *Product Data Book 1989*, 1989 pp. 5.85 through 5.115.
Brooktree "RAMDAC Products" Winter 1990 Product Selection Guide 1990, pp. 9–15.

*Primary Examiner*—Robert W. Beausoliel, Jr.
*Assistant Examiner*—Glenn Snyder
*Attorney, Agent, or Firm*—Richard L. Donaldson; James C. Kesterson

[57] ABSTRACT

Test circuitry (90) is provided which includes a multiplexer (118) for selectively receiving multiple bit control words defining test functions to be executed by said test circuitry and for outputting data from said test circuitry. A plurality of digital data inputs (96) are provided for receiving multiple bit words of digital data and a plurality of analog data inputs (98) are provided for receiving analog data. A register (120) is coupled to multiplexer (118) for storing a one of the multiple bit words received by multiplexer (118). Control circuitry (122) is coupled to register (120) for controlling execution of the test function defined by the control word being held in register (120). First test circuitry (112) is coupled to digital data inputs (96) and control circuitry (122) for passing digital data words received at digital data inputs (96) to multiplexer (118) for output in response to a first control word of said control words being held in register (120).

20 Claims, 13 Drawing Sheets

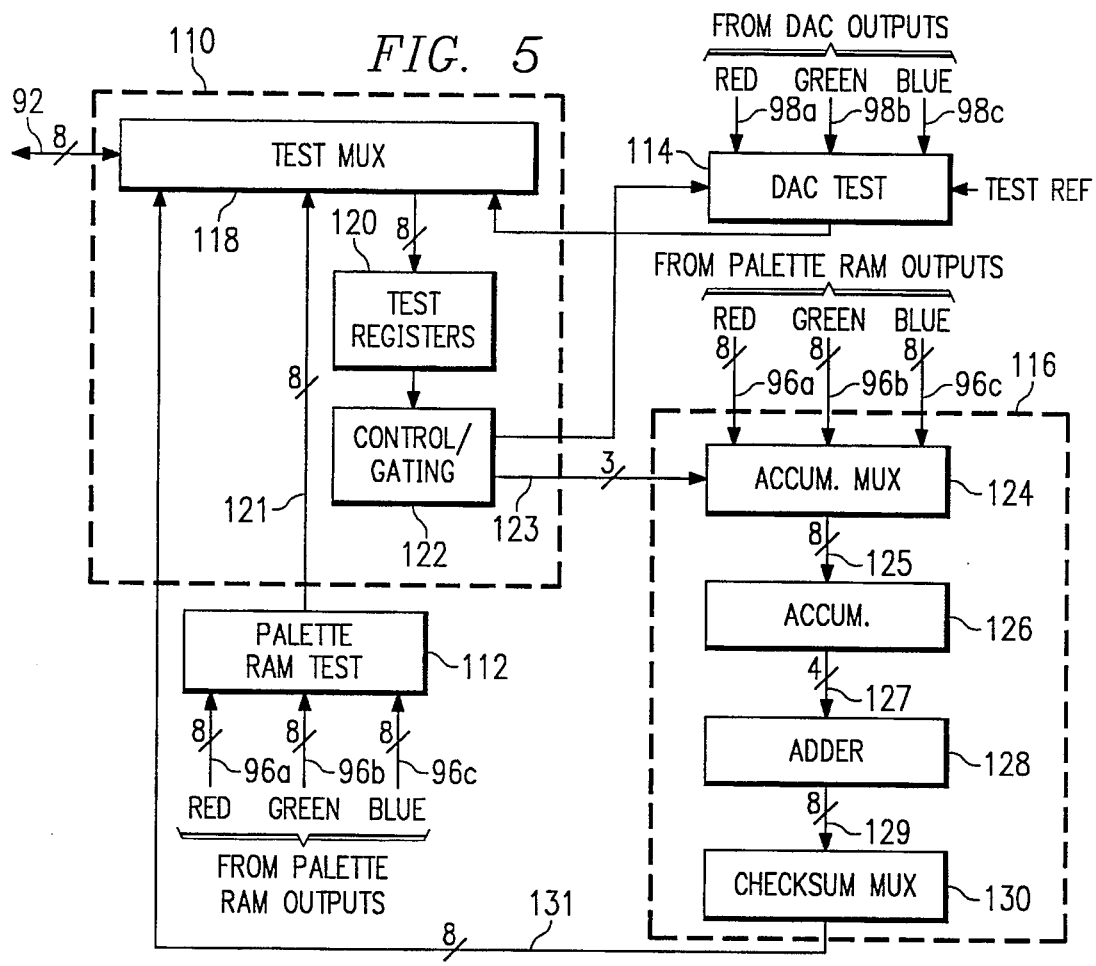
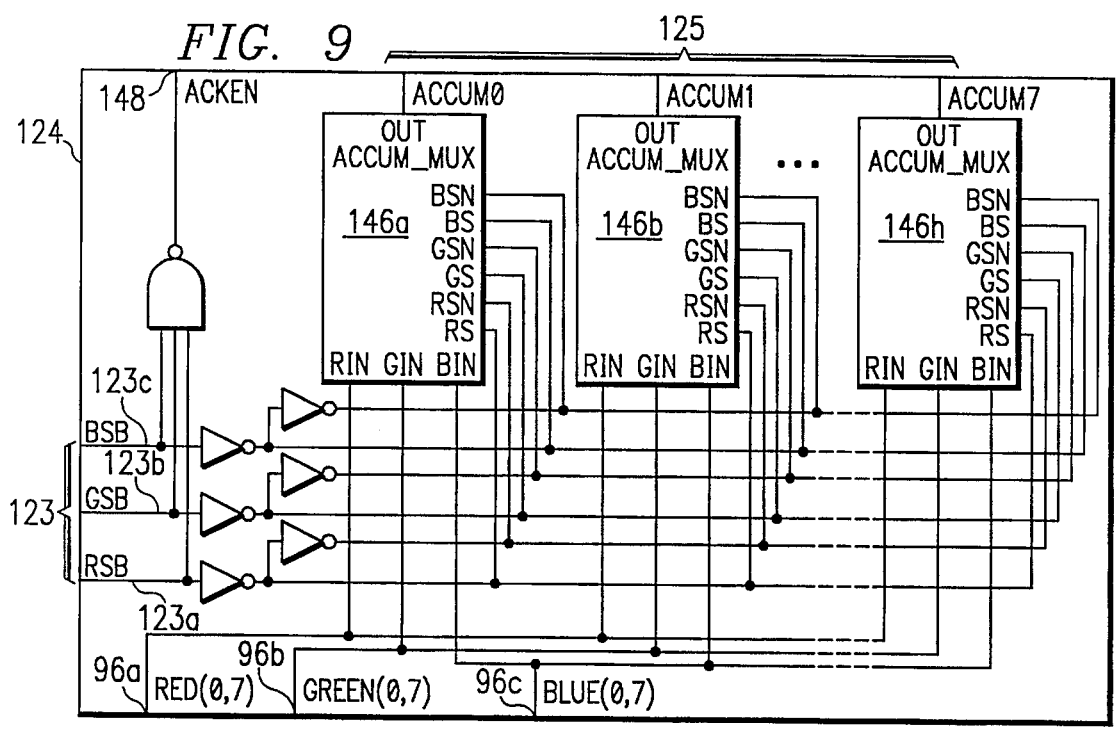

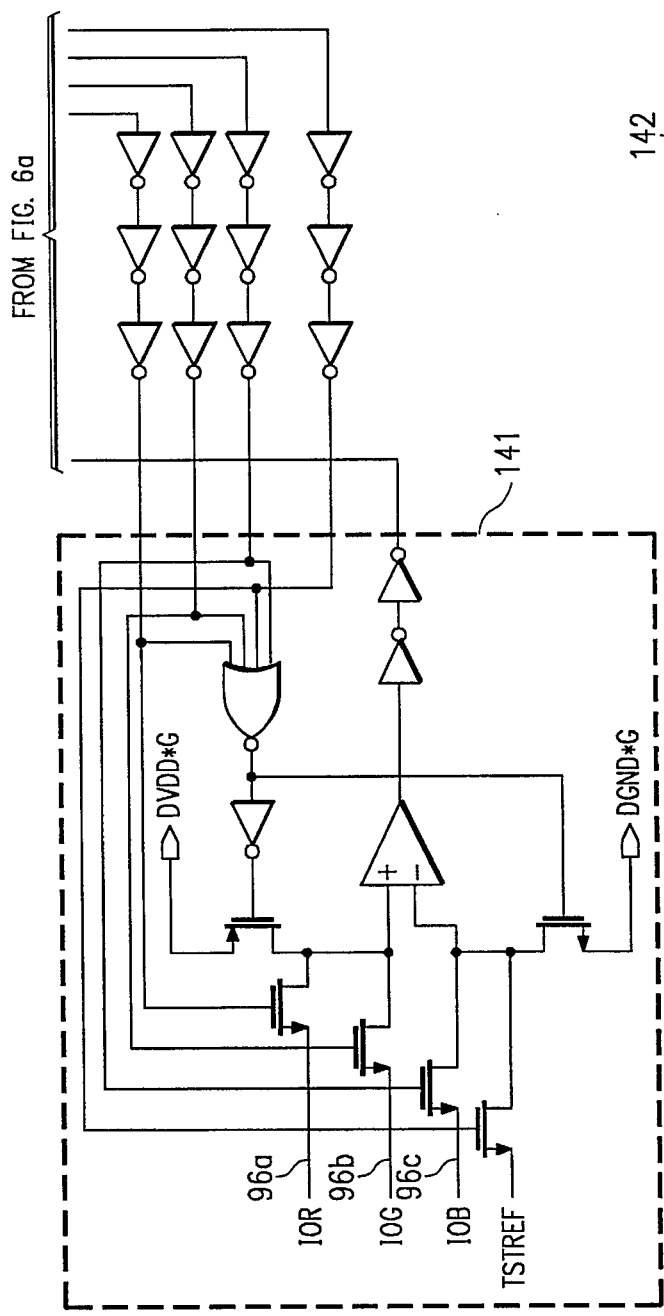
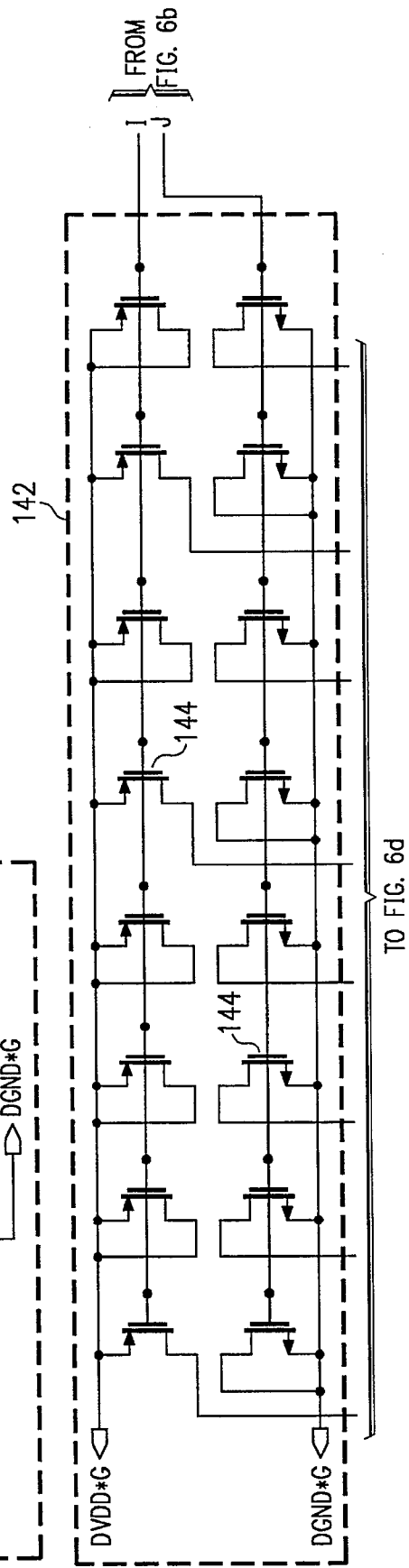
FIG. 6c

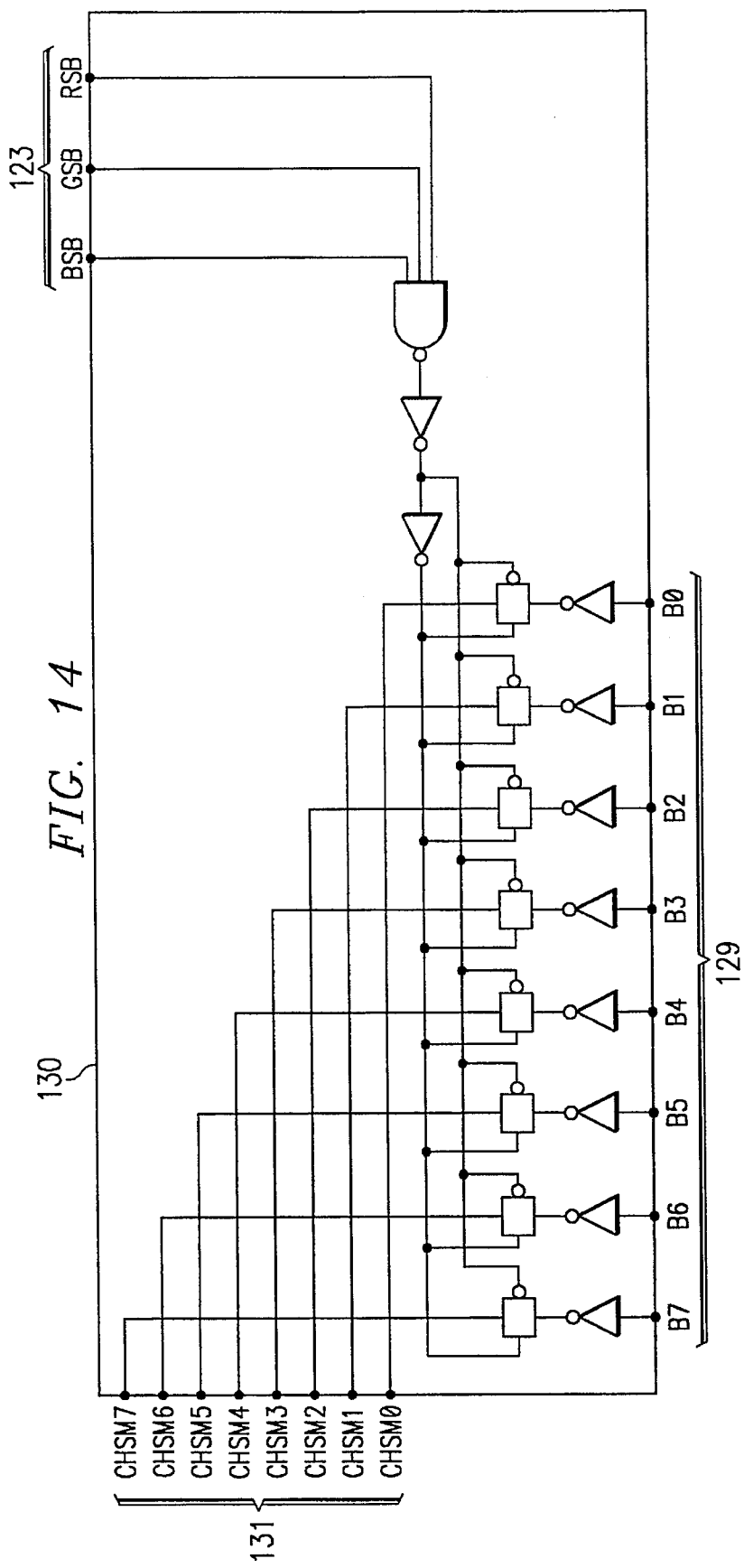

5,596,583

TEST CIRCUITRY, SYSTEMS AND METHODS

NOTICE (C) Copyright, Texas Instruments Incorporated, 1990. A portion of the Disclosure of this patent document contains material which is subject to copyright protection. The copyright owner has no objection to facsimile reproduction by anyone of the patent document or the patent disclosure, as it appears in the U.S. Patent and Trademark Office, patent file or records, but otherwise reserves all rights in its copyright whatsoever.

CROSS-REFERENCE TO RELATED APPLICATIONS

The following patent application, assigned to Texas Instruments Incorporated, the assignee of the present application, and is cross-referenced and incorporated into the present application by reference.

| Ser. No. | Docket No. | Title |
| --- | --- | --- |
| 07/544,775 | TI-15123 | PACKED BUS SELECTION OF MULTIPLE PIXEL DEPTHS IN PALETTE DEVICES, SYSTEM AND METHODS |

TECHNICAL FIELD OF THE INVENTION

The present invention relates in general to test circuitry, and in particular to test circuitry for graphics processors, systems and methods.

BACKGROUND OF THE INVENTION

Without limiting the general scope of the invention, its background is described in connection with computer graphics, as an example only.

In computer graphics systems, the low cost of dynamic random access memories (DRAM) has made it economical to provide a bit map or pixel map system memory. In such a bit map or pixel map memory, a color code is stored in a memory location corresponding to each pixel to be displayed. A video system is provided which recalls the color codes for each pixel and generates a raster scan video signal corresponding to the recalled color codes. Thus, the data stored in the memory determine the display by determining the color generated for each pixel (picture element) making up that display.

The requirement for a natural looking display and the minimization of required memory are conflicting. In order to have a natural looking display, it is necessary to have a large number of available colors. This, in turn, necessitates a large number of bits for each pixel in order to specify the particular color desired from among a large number of possibilities. The provision of a large number of bits per pixel, however, requires a large amount of memory for storage. Since a number of bits must be provided for each pixel in the display, even a modest size display would require a large memory. Thus, it is advantageous to provide some method of reducing the amount of memory needed to store the display while retaining the capability of choosing among a large number of colors.

The provision of a circuit called a color palette provides for a compromise between these conflicting requirements. The color palette stores color data words which specify colors to be displayed in a form that is ready for digital-to-analog conversion directly from the color palette. Color codes are stored in the bit map memory for each pixel having a limited number of bits, thereby reducing the memory requirements. The color codes are employed to select one of a number of color registers or palette locations. These color registers or palette locations each store color data words which are longer than the color codes in the pixel map memory. The number of such color registers or palette locations provided in the color palette is equal to the number of selections provided by the color codes. For example, a four bit color code can be used to select $2^4$ or 16 palette locations. The color data words can be redefined in the palette from frame-to-frame to provide many more colors in an ongoing sequence of frames than are present in any one frame.

Due to the advantages of color palette devices, systems and methods, any improvement in their implementation is advantageous in computer graphics technology. In particular, a need has arisen for test circuitry, methods and systems for use with graphics systems using color palette devices.

SUMMARY OF THE INVENTION

According to the invention, test circuitry is provided which includes a multiplexer for selectively receiving multiple bit control words defining test functions to be executed by the test circuitry and for outputting data from the test circuitry. A plurality of digital data inputs are provided for receiving multiple bit words of digital data and a plurality of analog data inputs are provided for receiving analog data. A register is coupled to the multiplexer for storing one of the multiple bit words received by the multiplexer. Control circuitry is coupled to the register for controlling execution of the test function defined by the control word being held in the register. First test circuitry is provided coupled to the digital data inputs, the multiplexer and the control circuitry for passing digital data words received at the digital data input to the multiplexer for output in response to a first control word being held in the register.

According to other aspects of the invention, second test circuitry is provided coupled to the digital inputs, the multiplexer and the control circuitry for determining number of logic ones comprising digital data words received at the digital data inputs and passing a result to the multiplexer for output in response to a second control word being held in the register. Third test circuitry is provided coupled to the plurality of analog data inputs, the multiplexer and the control circuitry for comparing first and second analog data received at the analog inputs and passing a result to the multiplexer for output in response to a third control word being held in the register.

The present invention provides significant improvement in the implementation of color palette devices in computer graphic system. The illustrated embodiments provide an interface for the data flow testing of the color data words output from the color palette memory. The present invention further provides for the ones accumulation of the stream of color data words being output from the color palette RAM. Finally, the present invention provides for the testing of analog data output from the digital analog converters of the color palette to the associated graphics display.

BRIEF DESCRIPTION OF THE DRAWINGS

For a more complete understanding of the illustrated embodiments of the present invention, and the advantages thereof, reference is now made to the following descriptions taken in conjunction with the accompanying drawings, in which:

FIG. 5 is a functional block diagram of the palette test/ones accumulation/DAC test circuitry depicted in FIG. 4;

FIGS. 6a through 6d are an electrical schematic diagram of the test multiplexer, test registers, control/gating circuitry, palette RAM test circuitry and DAC test circuitry depicted in FIG. 5;

FIG. 9 is an electrical schematic diagram of the accumulator multiplexer depicted in FIG. 5;

FIG. 14 is an electrical schematic diagram of the checksum multiplexer depicted in FIG. 5.

DETAILED DESCRIPTION OF ILLUSTRATED EMBODIMENTS

Figure 1:
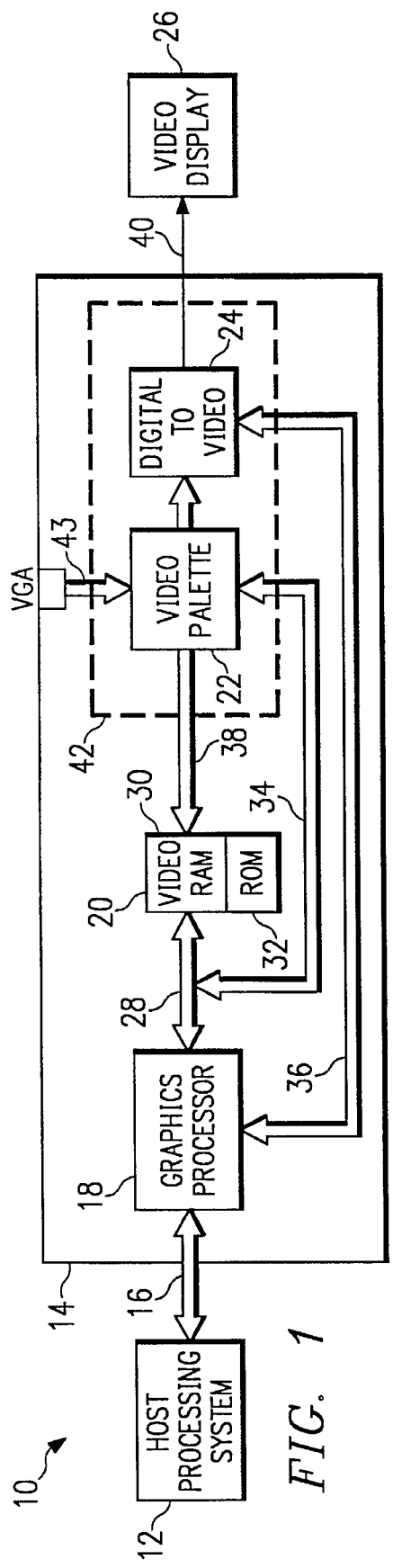
FIG. 1 is a functional block diagram of a graphics processor system utilizing one embodiment of the present invention.

Referring first to FIG. 1, a block diagram of a graphics computer system 10 is depicted as constructed in accordance with the principles of the illustrated embodiment of the present invention. For clarity and brevity in understanding the inventive concepts herein, a detailed description of the complete graphics processing system will not be provided. A more complete detailed discussion, however, can be found in patent application Ser. No. 07/544,775 filed Jun. 24, 1990, assigned to the assignee of the present application and hereby incorporated by reference. Also incorporated by reference herein are Texas Instruments TMS 34010 User's Guide (August 1988); TIGA-340 (TM) Interface, Texas Instruments Graphics Architecture, User's Guide, 1989, TMS 34020 User's Guide (January 1990), and TMS 44C251 Specification, all of which documents are currently available to the general public from Texas Instruments Incorporated. These documents give a more thorough description of graphics processing systems in general.

Graphics computer system 10 includes a host processing system 12 coupled to a graphics printed wiring board 14 through a bidirectional bus 16. Located on printed wiring board 14 are a graphics processor 18, memory 20, a video palette 22 and a digital-to-video converter 24. Video display 26 is driven by graphics board 14.

Host processing system 12 provides the major computational capacity for graphics computer system 10 and determines the content of the visual display to be presented to the user on video display 26. The details of the construction of host processing system 12 are conventional in nature and known in the art and therefore will not be discussed in further detail herein.

Graphics processor 18 provides the data manipulation capability required to generate the particular video display presented to the user. Graphics processor 18 is bidirectionally coupled to processing system 12 via bus 16. While graphics processor 18 operates as a data processor independent of host processing system 12, graphics processor 18 is fully responsive to requests output from host processing 12. Graphics processor 18 further communicates with memory 20 via video memory bus 28. Graphics processor 18 controls the data stored within video RAM 30, RAM 30 forming a portion of memory 20. In addition, graphics processor 18 may be controlled by programs stored in either video RAM 30 or in read-only memory 32. Read-only memory 32 may also include various types of graphic image data, such as alpha numeric characters in one or more font styles and frequently used icons. Further, graphics processor 18 controls data stored within video palette 22 via bidirectional bus 34. Finally, graphics processor 18 controls digital-to-video converter 24 via video control bus 36.

Video RAM 30 contains bit map graphic data which controls the video image presented to the user as manipulated by graphics processor 18. In addition, video data corresponding to the current display screen are output from video RAM 30 on bus 38 to video palette 22. Video RAM 20 may consist of a bank of several separate random access memory integrated circuits, the output of each circuit typically being only one or four bits wide as coupled to bus 38.

Video palette 22 receives high speed video data from video random access memory 30 via bus 38 and data from graphics processor 18 via bus 34. In turn, video palette 22 converts the data received on bus 38 into a video level which is output on bus 40. This conversion is achieved by means of a look-up table which is specified by graphics processor 18 via video memory bus 34. The output of video palette 22 may comprise color, hue and saturation signals for each picture element or may comprise red, green and blue primary color levels for each pixel. Digital-to-video converter 24 converts the digital output of video palette 22 into the necessary analog levels for application to video display 26 via bus 40.

Video palette 22 and digital-to-video converter 24 may be integrated together to form a "programmable palette" 42 or simply "palette" 42.

Video display 26 receives the video output from digital-to-video converter 24 and generates the specified video image for viewing by the user of graphics computer system 10. Significantly, video palette 22, digital-to-video converter 24 and video display 26 may operate in accordance with either of a two major video techniques. In the first technique, video data are specified in terms of color, hue and saturation for each individual pixel. In the second technique, the individual primary color levels of red, blue and green are specified for each individual pixel. Upon selection of the desired design using either of these two techniques, video palette 22, digital-to-video converter 24 and video display 26 are customized to implement the selected technique. However, the principles of the present invention in regard to the operation of the graphics processor 18 are unchanged regardless of the particular design choice of the video technique. All of the signals that contribute to display color in some way are regarded as color signals even though they may specifically define the individual red, blue and green color levels.

Figure 2:
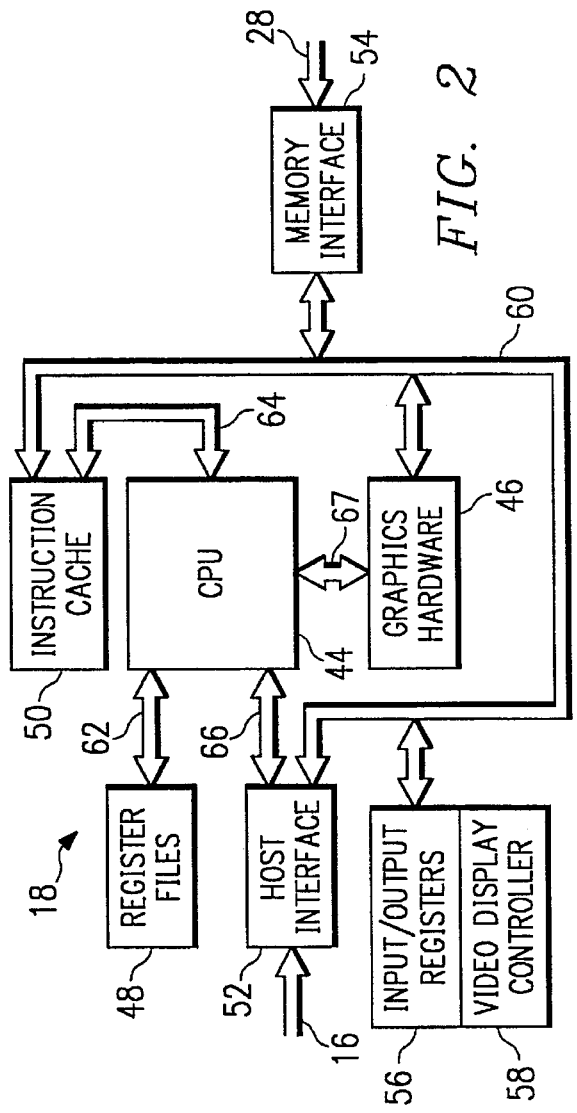
FIG. 2 is a functional block diagram of a graphics processor for use with the invention.

FIG. 2 illustrates graphics processor 18 in further detail. Graphics processor 18 includes a central processing unit 44, graphics hardware 46, register files 48, instruction cache 50, host interface 52, memory interface 54, input/output registers 56 and video display controller 58.

The central processing unit 44 performs a number of general purpose data processing functions including arithmetic and logic operations normally included in a general purpose central processing unit. In addition, central processing unit 44 controls a number of special purpose graphics instructions, either alone or in conjunction with graphics hardware 46.

Graphics processor 18 includes a major bus 60 which is connected to most parts of graphic processor 18, including central processing unit 44. Central processing unit 44 is bidirectionally coupled to a set of register files 48, including a number of data registers, via bidirectional register bus 62. Register files 48 serve as the repository of the immediately accessible data used by central processing unit 44.

Central processing unit 44 is also connected to instruction cache 50 by instruction cache bus 64. Instruction cache 50 is further coupled to bus 60 and may be loaded with instruction words from video memory 20 (FIG. 1) via video memory bus 28 and memory interface 54. The purpose of instruction cache 50 is to speed up the execution of certain functions of central processing unit 44. For example, a repetitive function that is often used within a particular portion of the program executed by central processing unit 44 may be stored within instruction cache 50. Access to instruction cache 50 via instruction cache bus 64 is much faster than access to video memory 20 and thus, the overall program executed by central processing unit 44 may be sped up by a preliminary loading of the repeated or often used sequences of instructions within instruction cache 50.

Host interface 52 is coupled to central processing unit 44 via host interface bus 66. Host interface 52 is further connected to host processing system 12 via host system bus 16. Host interface 52 serve to control the communications between host processing system 16 and graphics processor 18. Typically, host interface 52 would communicate graphics requests from the host processing system 16 to graphics processor 18, enabling host system 16 to specify the type of display to be generated by video display 26 and causing graphics processor 18 to perform a desired graphic function.

Central processing unit 44 is further coupled to graphics hardware 46 via graphics hardware bus 67. Graphics hardware 46 is additionally connected to major bus 60. Graphics hardware 46 operates in conjunction with central processing unit 44 to perform graphic processing operations. In particular, graphics hardware 46 under control of central processing 44 is operable to manipulate data within the bit map portion of video RAM 30.

Memory interface 54 is coupled to bus 60 and further coupled to video memory bus 28. Memory interface 54 serves to control the communication of data and instructions between graphics processor 18 and memory 20. Memory 20 includes both the bit map data to be displayed on video display 26 and the instructions and data necessary for the control and operation of graphics processor 18. These functions include control of the timing of memory access, and control of data and memory multiplexing.

Graphics processor 18 also includes input/output registers 56 and a video display controller 58. Input/output registers 56 are bidirectionally coupled to bus 60 to enable reading and writing within these registers. Input/output registers 56 are preferably within the ordinary memory space of central processing unit 44. Input/output registers 56 contain data which specify the control parameters of video display controller 58. In accordance with the data stored within the input/output registers 56, video display controller 58 controls the signals on video control bus 36 for the desired control of palette 42. For example, data within input/output registers 56 may include data for specifying the number of pixels per horizontal line, the horizontal synchronization and blanking intervals, the number of horizontal lines per frame and the vertical synchronization and blanking intervals.

Figure 3:
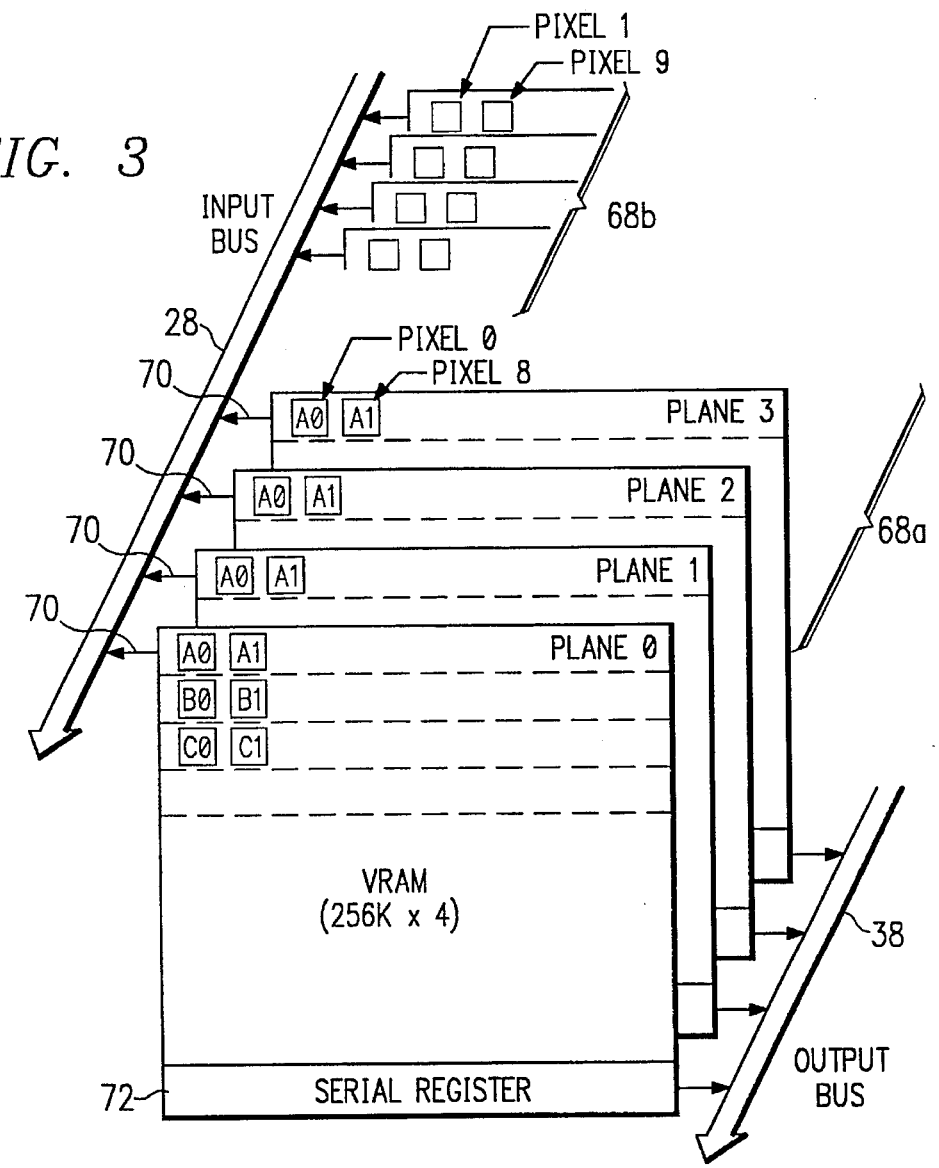
FIG. 3 depicts a preferred architecture for the video RAM depicted in FIG. 1.

Referring next to FIG. 3 a typical graphics memory system configuration for video RAM 30 is depicted in which eight VRAM memories 68 are used as an array, two of which are depicted as 68a and 68b. Each VRAM memory 68, or unit, includes four sections, or planes, 0, 1, 2 and 3. The construction of each plane is such that a single data lead 70 is used to write information to that plane. In a system which uses a 32-bit data bus, such as data bus 28, there would be eight VRAM memories, each VRAM memory having four data leads connected to the input data bus. For example, for 32-bit data bus 28, VRAM memory 68a would have its four data leads 70 connected to data bus 28 leads 0, 1, 2, and 3, respectively. Likewise, the next VRAM memory 68b would have its four leads 0, 1, 2, and 3 connected to data bus 28 leads 4, 5, 6, and 7, respectively. This pattern continues for the remaining six VRAMS such that the last VRAM has its leads connected to leads 28, 29, 30, 31 of bus 28.

The VRAM memories 68 are arranged such that the pixel information for the graphics display is stored serially across the planes in the same row. Assuming a four-bit per pixel system, then the bits for each pixel are stored in separate VRAM memory. In such a situation, pixel 0 would be the first VRAM 68a and pixel 1 would be the second VRAM 68b. Pixel storage for pixels 2–7 would likewise be accomplished with the six remaining VRAM (not shown) coupled to input bus 28. The pixel information for pixel 8 would be stored in the first VRAM 68a, still in row A, but in column 2 thereof.

Each VRAM plane has a serial register 72 for shifting out information from a row of memory. In the illustrated embodiment, the shifting out is performed in response to a shift clock signal SCLK (not shown) generated on palette 42 (FIG. 1). The outputs from these registers are connected to bus 38 in the same manner as the data input leads are connected to input bus 28. Thus, data from a row memory, such as row A, would be moved into register 72 and output serially from each register 72 and in parallel on bus 38. This would occur for each plane of the eight VRAM memory array.

The memory configuration depicted in FIG. 3 is not limited to the handling of four bit pixel description data. For example, if the information for each pixel was to be described in eight bits, then two VRAMs 68 would be required per pixel. Further, for increased ability in handling data, shift registers 72 would be split in half with each half used to output data onto bus 38. The split register approach allows for differences in the number of pixels required by the display and the number of bits per pixel desired. A more complete description of this feature can be found in co-assigned application Ser. No. 07/544,775 and hence, will not be repeated here.

Referring to FIGS. 1 and 2, graphics processor 18 operates in two different address modes to address memory 20.

These two address modes are X-Y addressing and linear addressing. In linear addressing, the start of a field is formed by a single multibit linear address. The field size is determined by the data within a status register within central processing unit 44. In X-Y addressing, the start address is a pair of X and Y coordinate values. The field size is equal to the size of a pixel, that is, the number of bits required to specify the particular data of a particular pixel.

Figure 4:
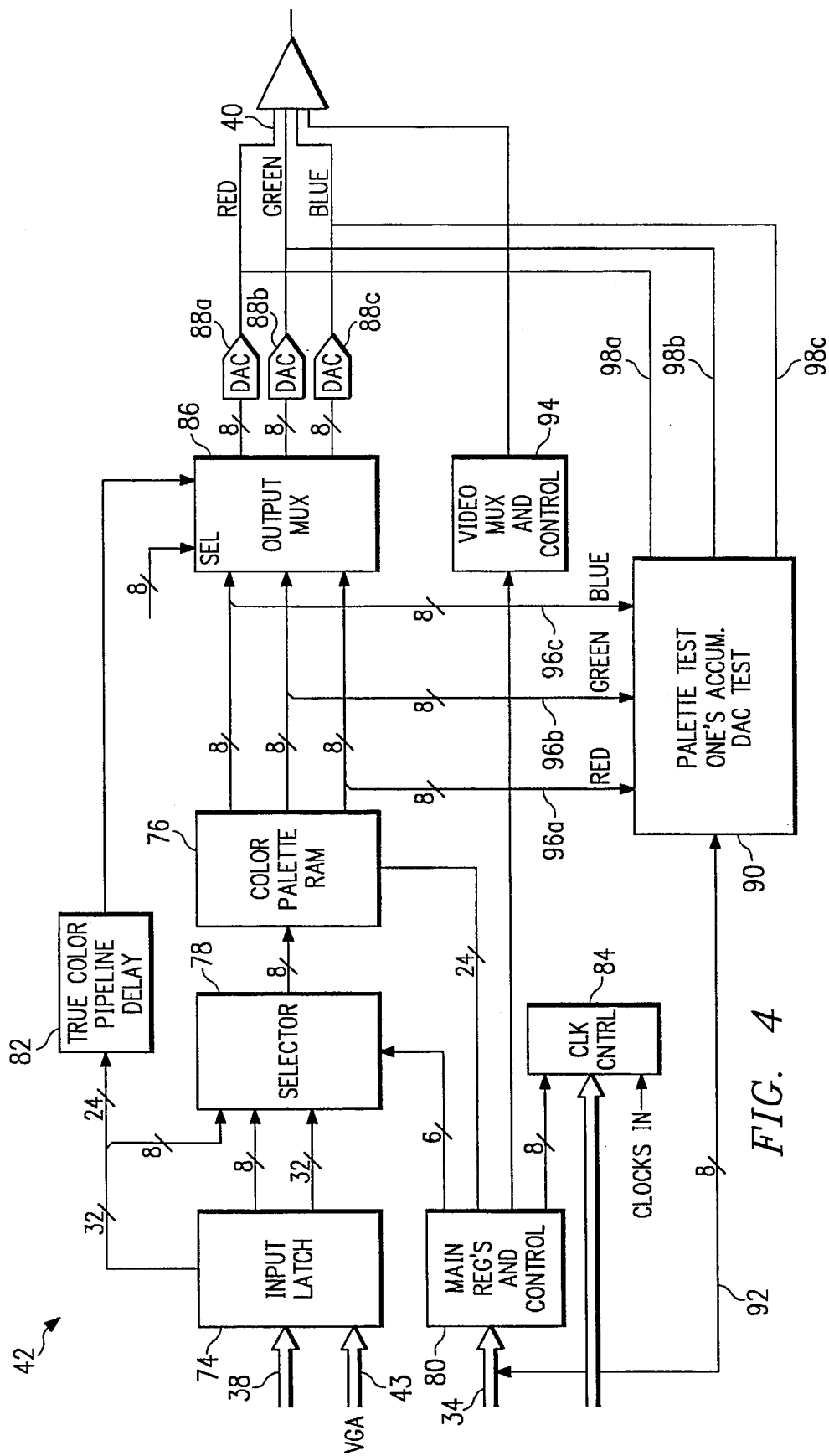
FIG. 4 is a functional block diagram of the video palette depicted in FIG. 1.
Figure 6A:
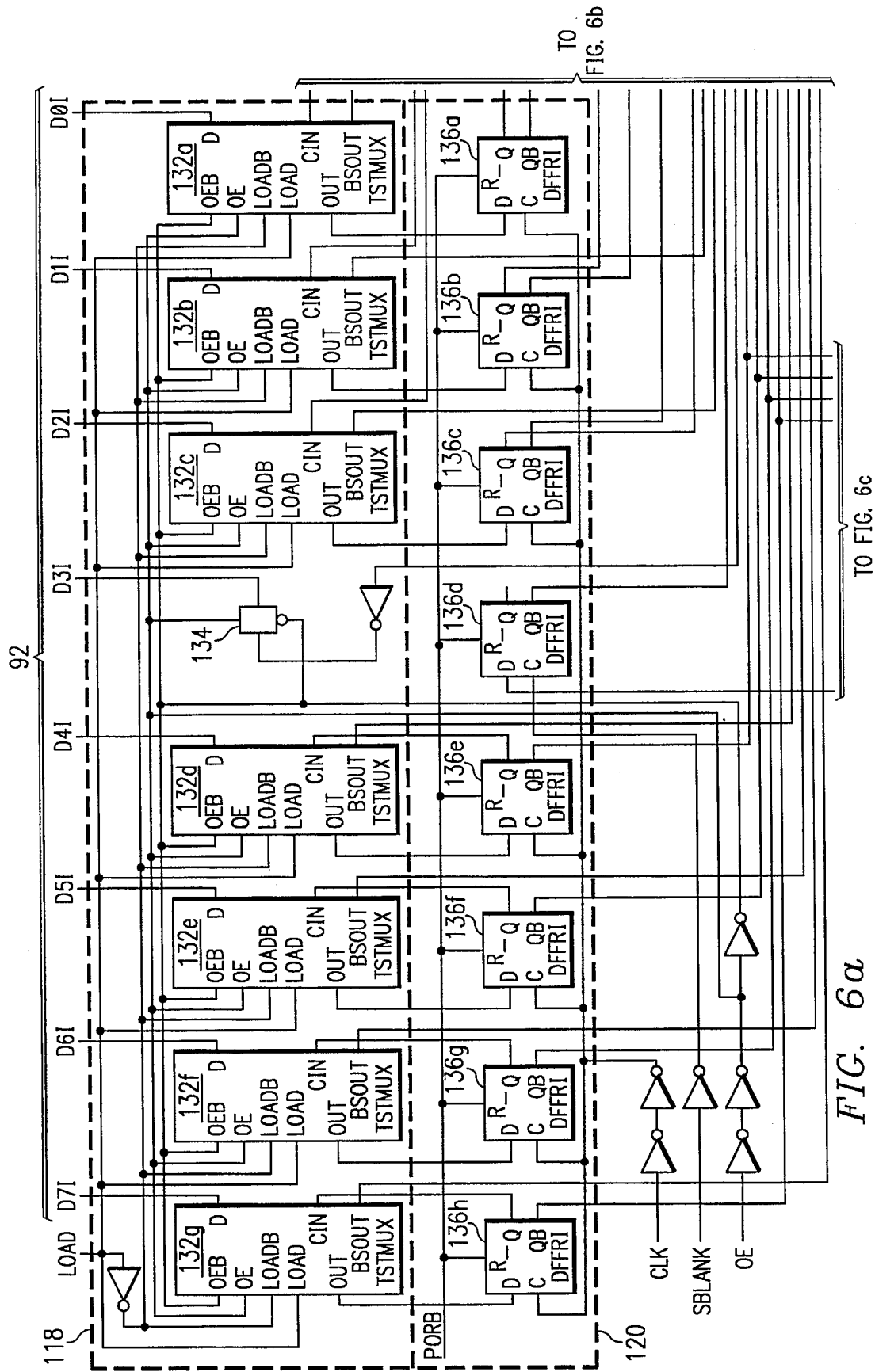
Figure 6B:
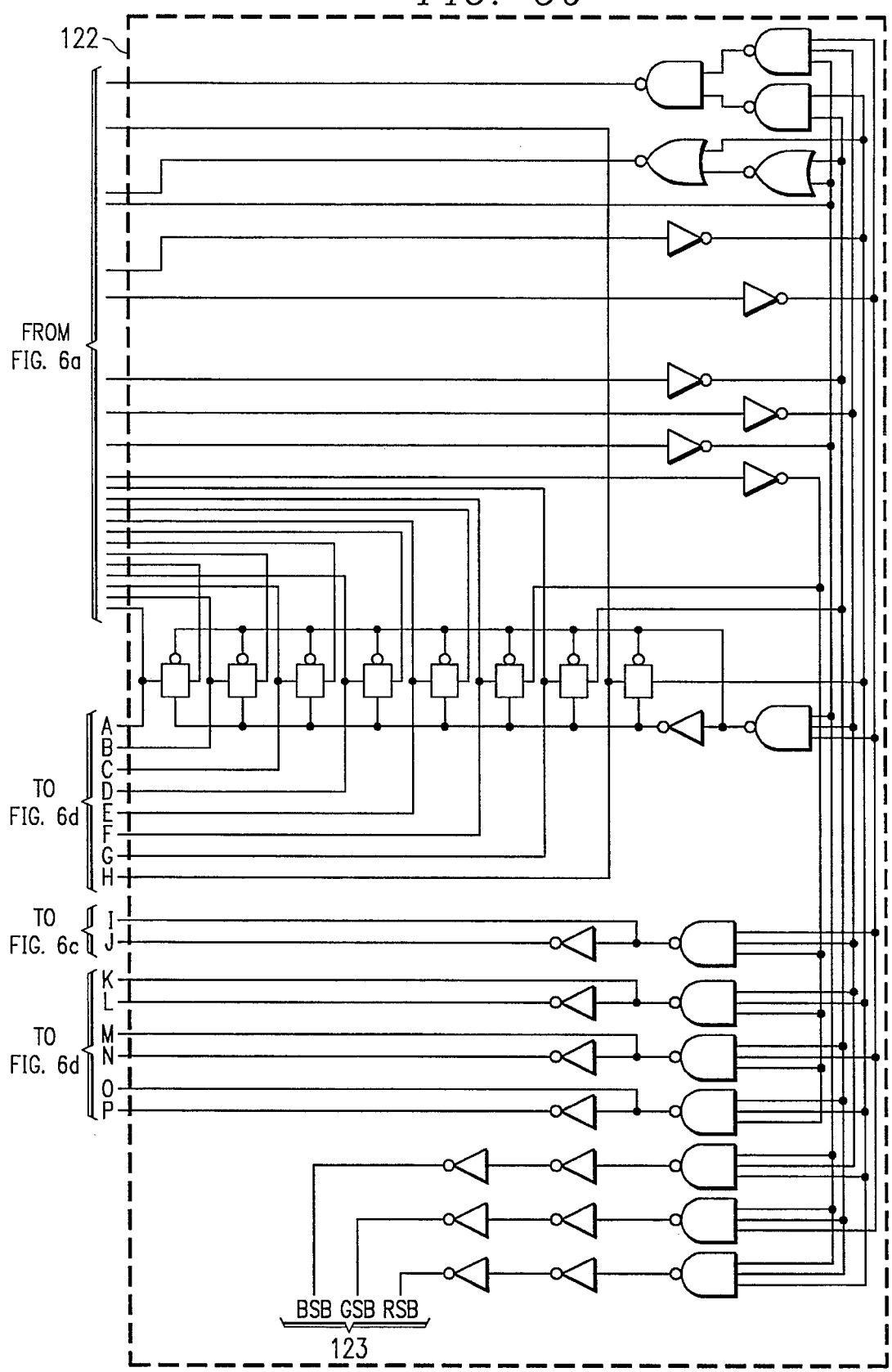
Figure 6D:
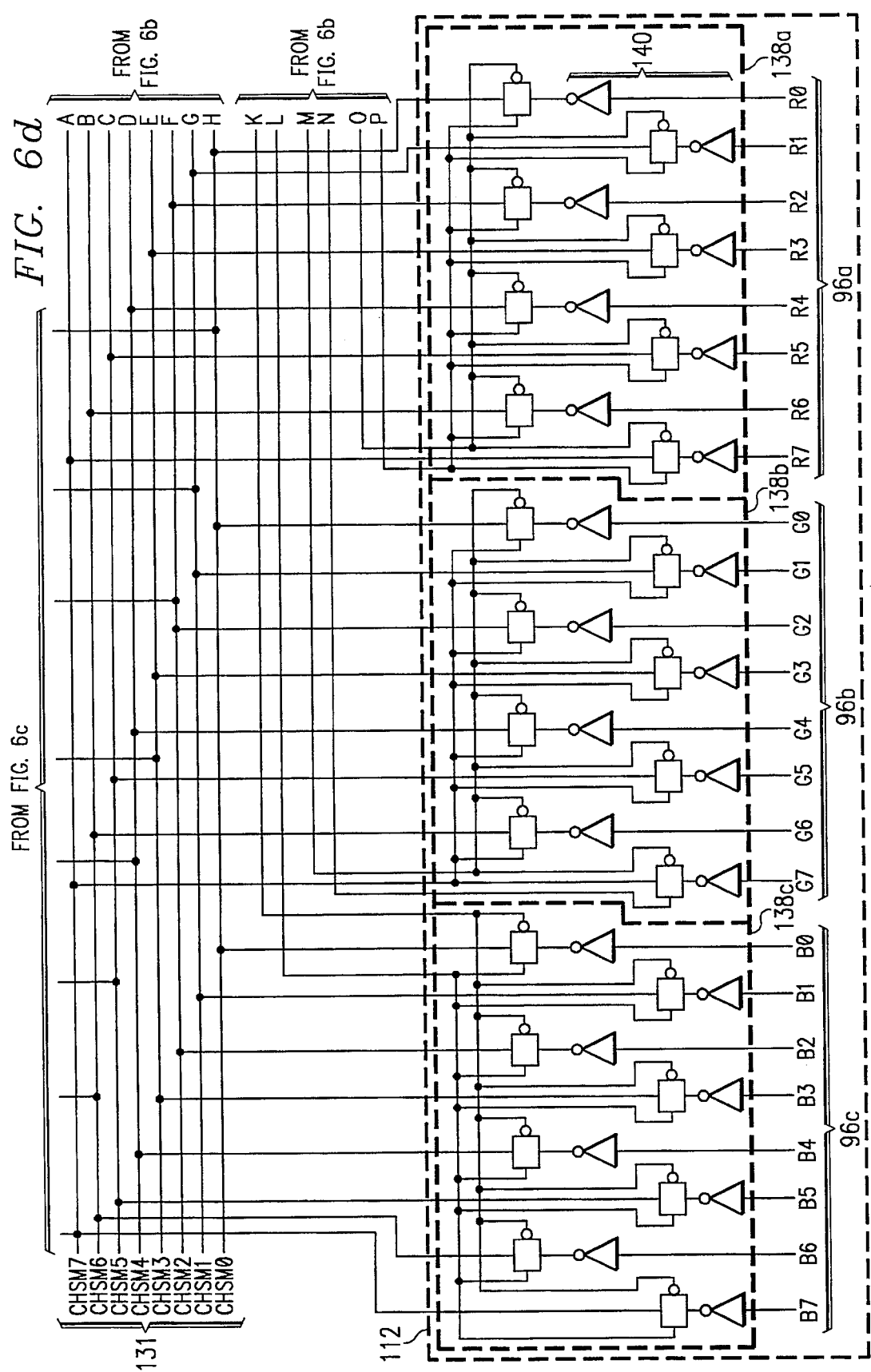

FIG. 4 is a more detailed depiction of palette 42 emphasizing the color palette RAM and the circuitry controlling it. Palette 42 includes an input latch 74 coupled to video memory 20 (FIG. 1) via bus 38. In the illustrated embodiment, input latch 74 receives color codes output from eight VRAM memories 68 comprising video RAM memory 30. Color palette RAM 76 then provides color data words in response to color codes received at input latch 74. Selector 78 couples color palette RAM 76 and input latch 74, in the illustrated embodiment receiving 32 bits of color code data from latch 74 and sequentially outputs four 8-bit words of address data to color palette RAM 76.

In the depicted example, RAM 76 is of a 256×24 bit architecture with each 8-bit address from selector 78 outputing a 24-bit word. The 24-bits output provide three 8-bit words of red, blue or green, data for conversion and output by digital to analog converters 88. In the illustrated embodiment color palette RAM 76 is a high speed dual-port static RAM (SRAM), however color palette RAM 76 may also be implemented using dynamic random access memories (DRAMs).

Graphics processor 18 (FIG. 2) controls the contents of the color data words output to video display 26 in response to color codes received at latch 74 by the reading and writing of color data words into and out of color palette RAM 76 using registers and control circuitry 80 and bus 34. Preferably, the second port of a dual-port RAM is used for this data revision/update function. When a 256×24 bit memory is used, red, green and blue data are written in as a concatenated 24-bit word with an 8-bit address determining the memory location. Palette 42 also includes true color pipeline delay 82, clock control circuitry 84, output multiplexer 86 and digital-to-analog converters 88. Also depicted in FIG. 4 are palette test circuitry 90, analog test registers 92, and video multiplexer and control circuitry 94. For a more complete description of these components, reference is made to pending application Ser. No. 07/544,775 incorporated herein by reference.

FIG. 5 is a block diagram depicting the major functional circuits comprising palette test circuitry 90 which includes control circuitry 110, palette RAM test circuitry 112, digital-to-analog converter test circuitry 114 and ones accumulation circuitry 116. Circuitry 110 controls the overall functioning of palette tests circuitry 90 and includes test multiplexer 118, test registers 120 and control and gating circuitry 122. Test multiplexers 118 control the receipt of control signals from graphics processor 18 on bidirectional bus 92 and the transmittal of the requested test information back to graphics processor 18 on bidirectional bus 92. Test registers 120 receive bits of information from graphics processor 18 through test multiplexer 118 and in conjunction with control and gating circuitry 122, control the initiation of the test function required by graphics processor 18 as specified by the received test bits.

When specified by the bits written into test registers 120, palette RAM test circuitry 112 in conjunction with control circuitry 110, receives 8-bit words of red, green and blue data from color palette RAM 76 on bus 96 and transmits a selected word of either red, green or blue data via bus 121 and bidirectional bus 92 to processor 18. In the preferred operating mode, the red, green, and blue color data words are transmitted to graphics processor 18 cyclically, as is discussed below.

DAC test circuitry 114 tests the red, green, and blue analog outputs of respective digital-to-analog converters 88a–c on corresponding lines 98a–c. DAC test circuitry 114 compares the output of each digital-to-analog converter 88a–c provided on corresponding line 98a–c against the respective outputs of the other two digital-to-analog converters 88a–c (on corresponding lines 98a–c) and against a test reference voltage. As in the case of palette RAM testing, the testing of digital-to-analog converters 88a–c is performed in accordance with bits written into test registers 120, and may be sequentially executed, as discussed further below.

Ones accumulation circuitry 116 provides for a running sum of logic ones comprising the red, green, and blue 8-bit color data words being output from color palette RAM 76. Accumulator multiplexer 124 in conjunction with control circuitry 110 provides for the selection of either the red, green, or blue color data received on 24-bit bus 96 from color palette RAM 76 to initiate the ones accumulation processing. The stream of 8-bit words of either red, green, or blue color data are then fed 8-bit via bus 125 into accumulator 126. For each 8-bit word of color data received, accumulator 126 first determines in parallel the number of logic ones making up each of the two 4-bit nibbles making up the word. Accumulator 126 then adds the number of logic ones determined for each 4-bit nibble to determine the total number of ones for each 8-bit color data word received. A 4-bit word representing the number of logic ones in each 8-bit color data word received is then passed via 4-bit bus 127 to adder 128, which takes a running sum of the number of ones being determined by accumulator 126 for the stream of 8-bit color data words received from color palette RAM 76. The running sum is then output through checksum multiplexer 130 and 8-bit bus 131 to test multiplexer 118 for transmittal via bidirectional bus 92 to graphics processor 18.

Referring next to FIGS. 6a–6d, portions of the circuitry depicted in FIG. 5 can now be described in further detail. Test multiplexer 118 (FIG. 6a) allows for the input and output of 8-bit words to and from bidirectional bus 92 and graphics processor 18. Output from multiplexers 132 is timed by output enable signal OE generated by processor 18. Output from multiplexers 132 is timed by output enable signal OE generated by processor 18. Test multiplexer 118 includes seven 1-bit multiplexers 132 for controlling the data exchange of bits on input/output ports D0–D2 and D4–D7 into and out of test circuitry. Output of data on port D3 is controlled by a transmission gate 134 alone.

Test registers 120 (FIG. 6a) are made up of eight latches 136. Latches 136a–136c receive and latch data bits received on ports D0–D2 from respective multiplexers 132a–132c. Latches 136a–136c comprise the control register, which when loaded with a 3-bit code from graphics processor 18, sets the test function to be performed. Latch 136d latches the result of the digital-to-analog conversion test. Latches 136e–136h receive and hold a 4-bit control word from bidirectional bus 92 through respective multiplexers 132d–132g. The 4-bit data word latched into latches 136e–136h determines the comparisons signal comparisons to be made by digital-to-analog converter test circuitry 114. Power on reset signal (PORB) resets latches 136a–136h upon initial power up of test circuitry 90. Writing into latches 136 is timed by a clocking signal CLK.

Table I provided herein in the Appendix, cross-references the three bits of control data, entered into the control register comprising latches 136a–136c by processor 18, with the test function performed. Table II cross-references the bits input into latches 136a–136h to select the comparisons to be made for the outputs of each of the digital-to-analog converters 88a–c. Table II also indicates the output of latch 136d corresponding to the result of the selected comparison. (Reference to the Appendix attached hereto).

Figure 7:
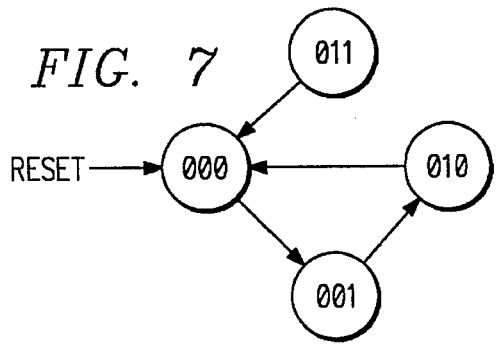
FIG. 7 is a state diagram depicting the operation of the palette RAM test according to the present invention.

Palette RAM test circuitry 112 (FIG. 6d) comprises three groups 138a–138c of eight buffer/transmission gate circuits 140 each. Under the control of the control bits latched into latches 136a–136c and control/gating circuitry 122 (FIG. 6b), group 138a is operable to pass 8-bit red data words received on bus 96a, group 138b operable to pass green data received on bus 96b and group 138c operable to pass 8-bits of blue data received on bus 96c. The 8-bit words of red, green, and blue data transmitted through groups 138 of buffer/transmission gates 140 is then passed to graphics processor 18 through test multiplexer 118 and bidirectional bus 92. Each value of red, green or blue color data passed to processor 18 correspond to the location in RAM 76 currently pointed to by selector 78. The test sequentially executed by control/gating circuitry 122 (FIG. 6b) according to state machine depicted in FIG. 7. For example, if a 001 is entered into latches 136a–c, as specified in Table I, then GREEN data output on bus 96b will initially be transmitted to processor 18 followed by the transmittal of BLUE data on bus 96c and RED data on bus 96a in accordance to the state machine of FIG. 7. The sequential transmittal of red, green and blue data continues until new bits are written into latches 136a–c to define a new test state.

As indicated in Table I, when a 111 is input into the control register (latches 136a–136c), the analog DAC test is selected. Digital-to-analog test circuit 114 includes a comparator circuit 141 (FIG. 6d) which receives red, green, and blue analog data output from digital-to-analog converters 88a–c on lines 98a–98c, respectively, and makes the voltage comparisons corresponding to the data bits latched into latches 136e–136h in accordance with Table II. The red, green and blue analog outputs of digital-to-analog converters 88a–c may be made against each other and against a voltage reference, typically 145 mV. As indicated in Table II, the result of the selected test of the voltage comparison are latched into as a single bit latch 136d, such that the bit can be read by processor 18 via bus 92.

Also included is identification code circuitry 142 which may be used for the software identification of different versions or sub-routines used in test circuitry 90. Identification code circuitry 142 is comprised of a plurality of transistors 144 which are set during the manufacture of circuitry 142 to either conduct or provide a high impedance. As indicated in Table I, when a 011 is entered into the control register (latches 136a–136c), a voltage can be applied across the transistors of identification code circuitry 142 in order to "read" the identification code. In the illustrated embodiment, a 75 encoded in hexadecimal has been inserted as the identification code.

Figure 8:
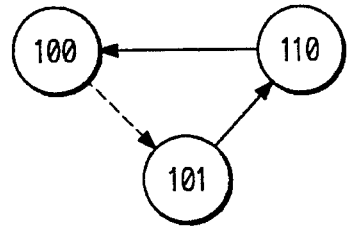
FIG. 8 is a state diagram depicting the operation of the ones accumulation test function according to the present invention.

In accordance with the values described in Table II and latched into latches 136a–136c, control circuity 122 (FIG. 6b) can initiate the ones accumulation process for either the red, green, or blue data being output from color palette 76 by setting high one of the three control lines making up bus 123. When line 123a is high, the red data is selected to initiate ones accumulation, when line 123b is set high the green data is selected and when 123c is high, the blue data is selected. When the ones accumulation is complete, the 8-bits of ones accumulation data for the 8-bit red, green, and blue color data words is received by control circuitry 122 through bus 131 and passed through multiplexers 132 to bidirectional bus 92 and on to graphics processor 18. Graphics processor 18 can then process the ones accumulation data to detect the output of errors from palette RAM 76. Similar to the RAM output test, the one's accumulation function automatically increments following the state machine depicted in FIG. 8. For example, of a 101 is entered into latches 136a–c, the accumulation processing will start with the green data on bus 96b, followed by the blue data on bus 96c and the red data on 96a. The cycles continue until the color data for the entire screen to be displayed on video display 26 (FIG. 1) has been accumulated. If the display screen is fixed, graphics processor should detect constant value for the one's accumulation, otherwise an error exists. The eight bit word output from one's accumulation circuitry 116 by checksum multiplexer 130 is truncated when the running sum overflows.

Figure 10:
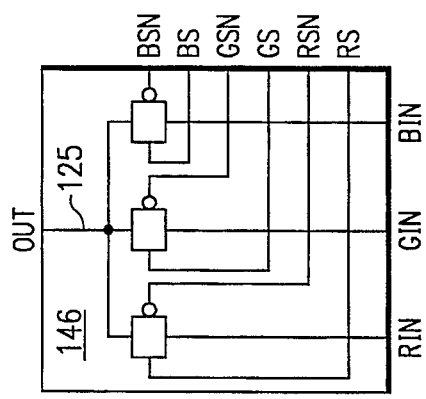
FIG. 10 is an electrical schematic diagram of a selected one of the single bit multiplexers depicted in FIG. 9.

FIG. 9 is more detailed block diagram of a accumulator multiplexer 125. Accumulator multiplexer 125 selects the 8-bit word of either red data on bus 96a, green data on bus 96b, or blue data on bus 96c to passed to accumulator 126 for one's accumulation. The selection is made in response to the activation of one of three bits from control/gating circuitry 122 on bus 123. When bit 123a is set high, 8-bits of red data on line 96a are passed, when bit 123b is set high, 8-bits of green data on bus 96b are passed and when bit 123c is set high, 8-bits of blue on bus 96c are passed. As discussed above, test registers 120 and control/gating circuitry 122 cycle through the red, green, and blue data in accordance with the state machine depicted in FIG. 8, such that one's accumulation for an entire display screen can be calculated. Accumulator multiplexer 125 includes multiplexers 146a–146h, each of which is operable to pass one bit of the selected 8-bit word of either red, green, or blue color data. A more detailed electrical schematic diagram of a selected multiplexer 146 is provided in FIG. 10. Accumulation multiplexer 125 outputs the selected 8-bits of color data on 8-bit bus 125 along with clock enable signal ACKEN on line 148.

Figure 11:
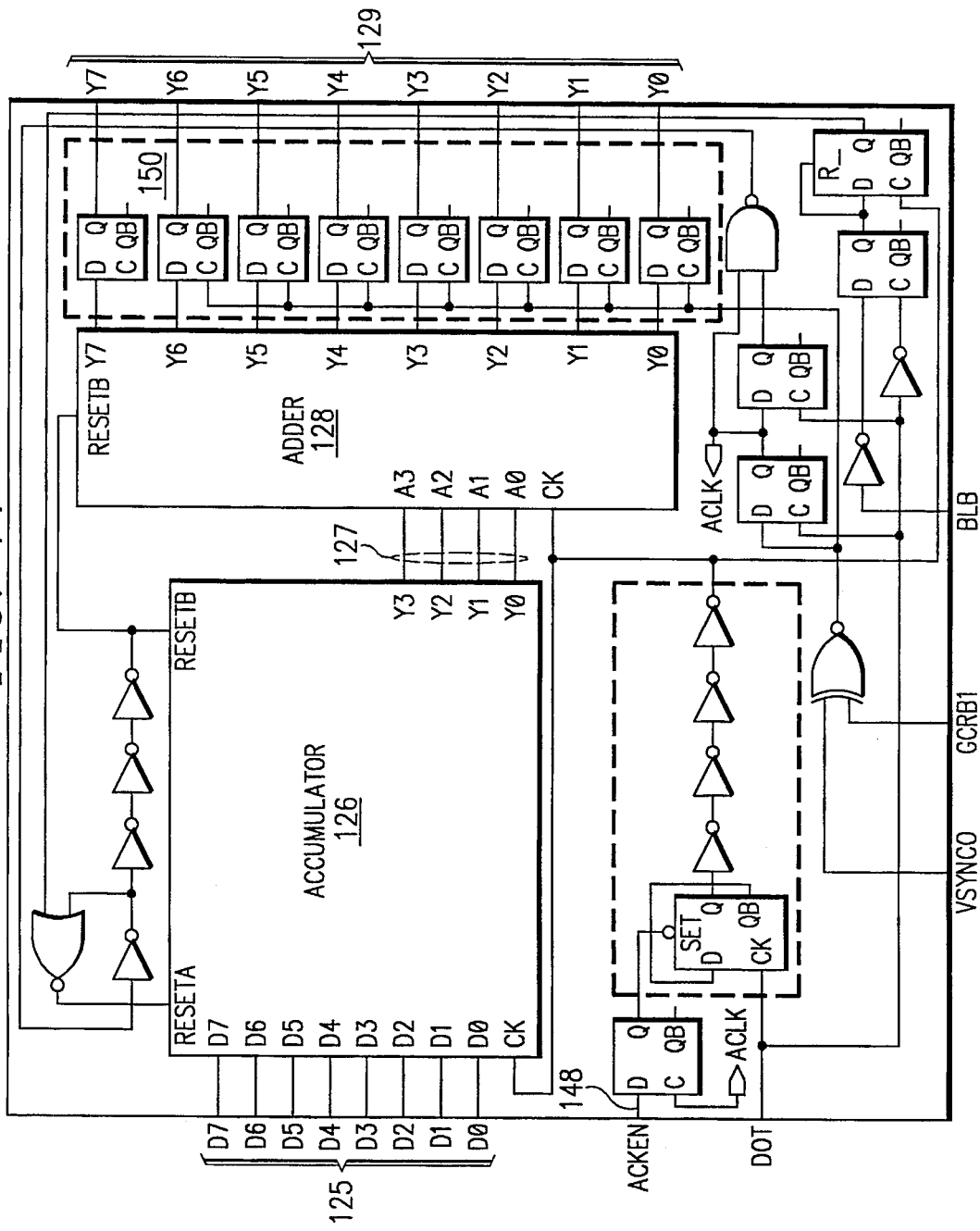
FIG. 11 is a functional block diagram of the accumulator and adder depicted in FIG. 5.

FIG. 11 depicts accumulator 126 and adder 128 and their associated control circuitry. Accumulator 126 calculates the number of ones in each 8-bit word received on bus 125 from accumulator multiplexer 124 and outputs a 4-bit word on bus 127 in response. Adder 128 takes a running sum of the number of ones for the stream of color data corresponding to the screen being displayed on video display 26. Control of accumulator 126 and adder 128 is accomplished through the system DOT clock, the clock enable signal ACKEN received on bus 148 from accumulator multiplexer 124, the system general control register bit (GCRB1), the video display vertical synchronization signal VSYNCO (providing vertical synchronization for the screen displayed on display 26) and the video display blanking signal (BLB) for display 26. Accumulator 126 and adder 128 are clocked at a rate equal to one-half the system DOT clock rate. In the preferred embodiment, for high speed operation therefore, only every other 24-bit word (comprising three 8-bit words of red, blue and green color data) is actually taken for the ones accumulation test. Blanking signal BLB goes low at the beginning of each blanking interval for video display 26 and resets the input registers to accumulator 126 (see FIG. 12). The final value for the ones accumulation for the displayed screen is clocked out by latches 150 on the falling edge of the vertical synchronization signal (VSYNC) for the screen being displayed on video display 26. Also on the falling edge of video synchronization signal VSYNCO, the nibble adder circuitry of accumulator 126 (see FIG. 12) and adder 128 (see FIG. 13) are reset awaiting a stream of color data corresponding to the next screen to be displayed.

Figure 12A:
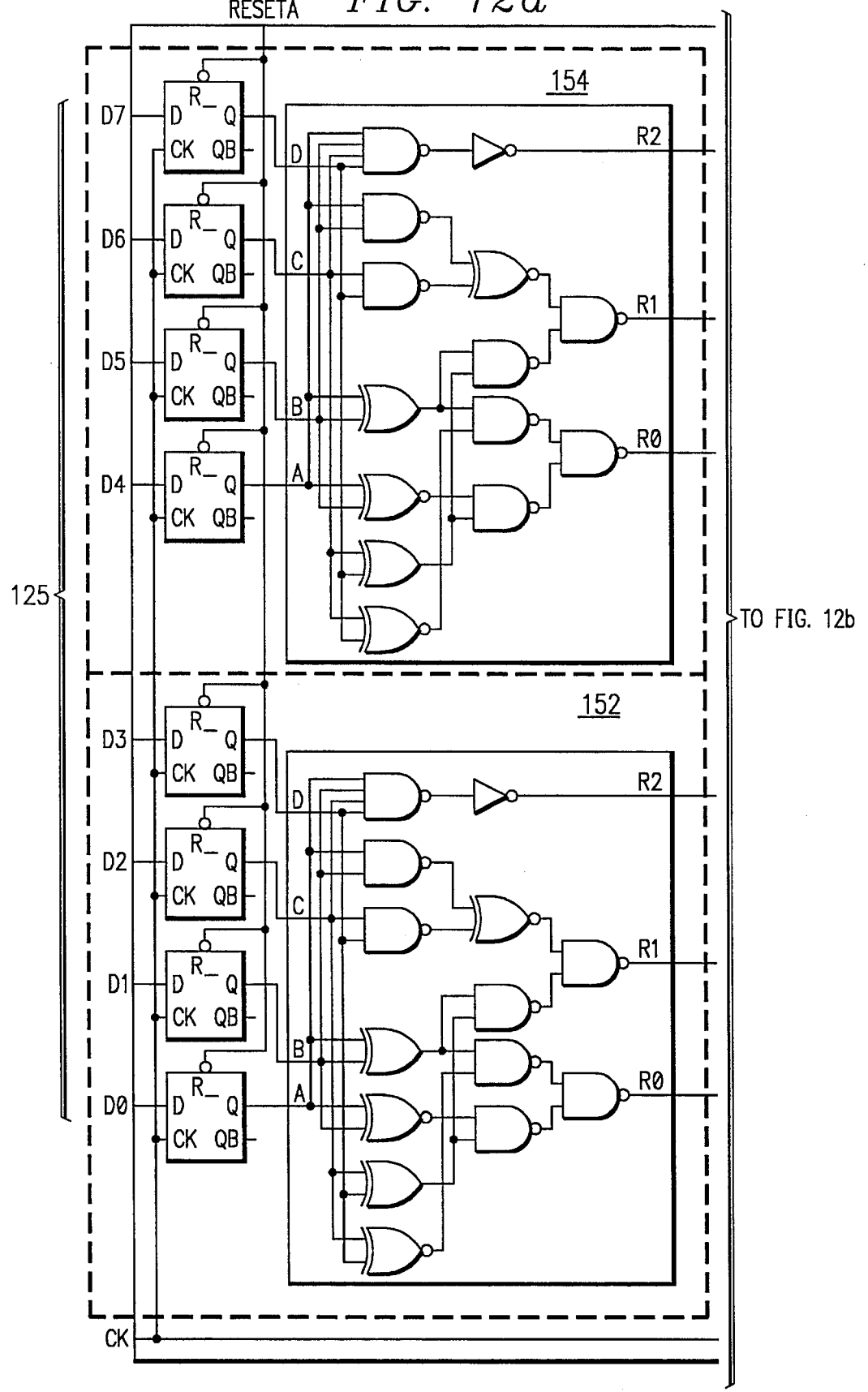
FIGS. 12a and 12b are an electrical schematic diagram of the accumulator depicted in FIG. 5.
Figure 12B:
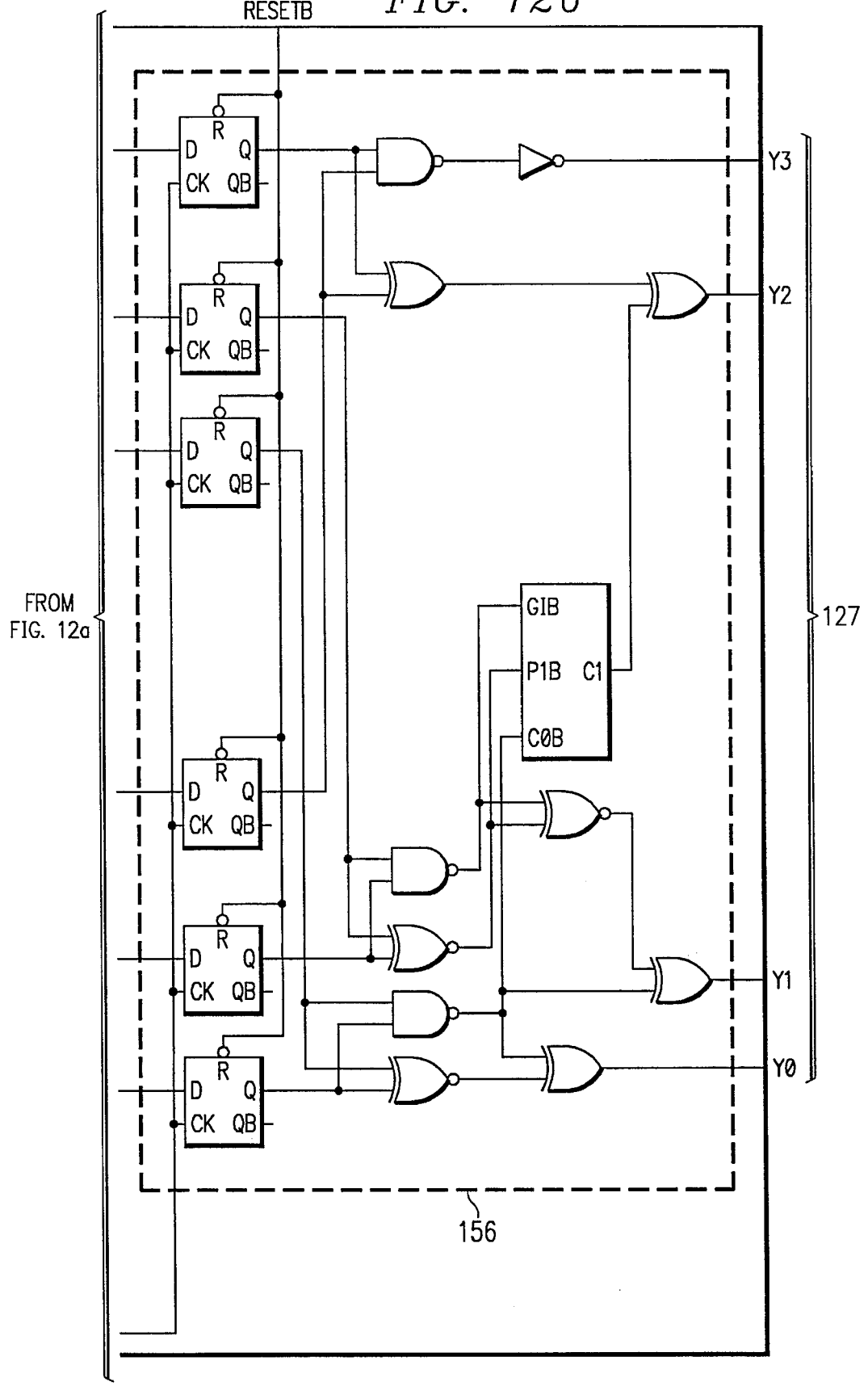

FIGS. 12a and 12b are electrical schematic diagrams of accumulator 126. Section 152 determines the number of ones comprising the first 4-bit nibble (bits D0–D3) of the 8-bit word received on bus 125 from accumulator multiplexer 124. In a similar fashion, section 154 determines the number of ones in the second 4-bit nibble (bits D4–D7) making up the 8-bit word received on bus 125. Adder 156 then adds the number of ones determined for each of the two 4-bit nibbles and outputs a 4-bit word on bus 127 corresponding to the total number of ones making up the 8-bit word of color data received on bus 125.

Figure 13:
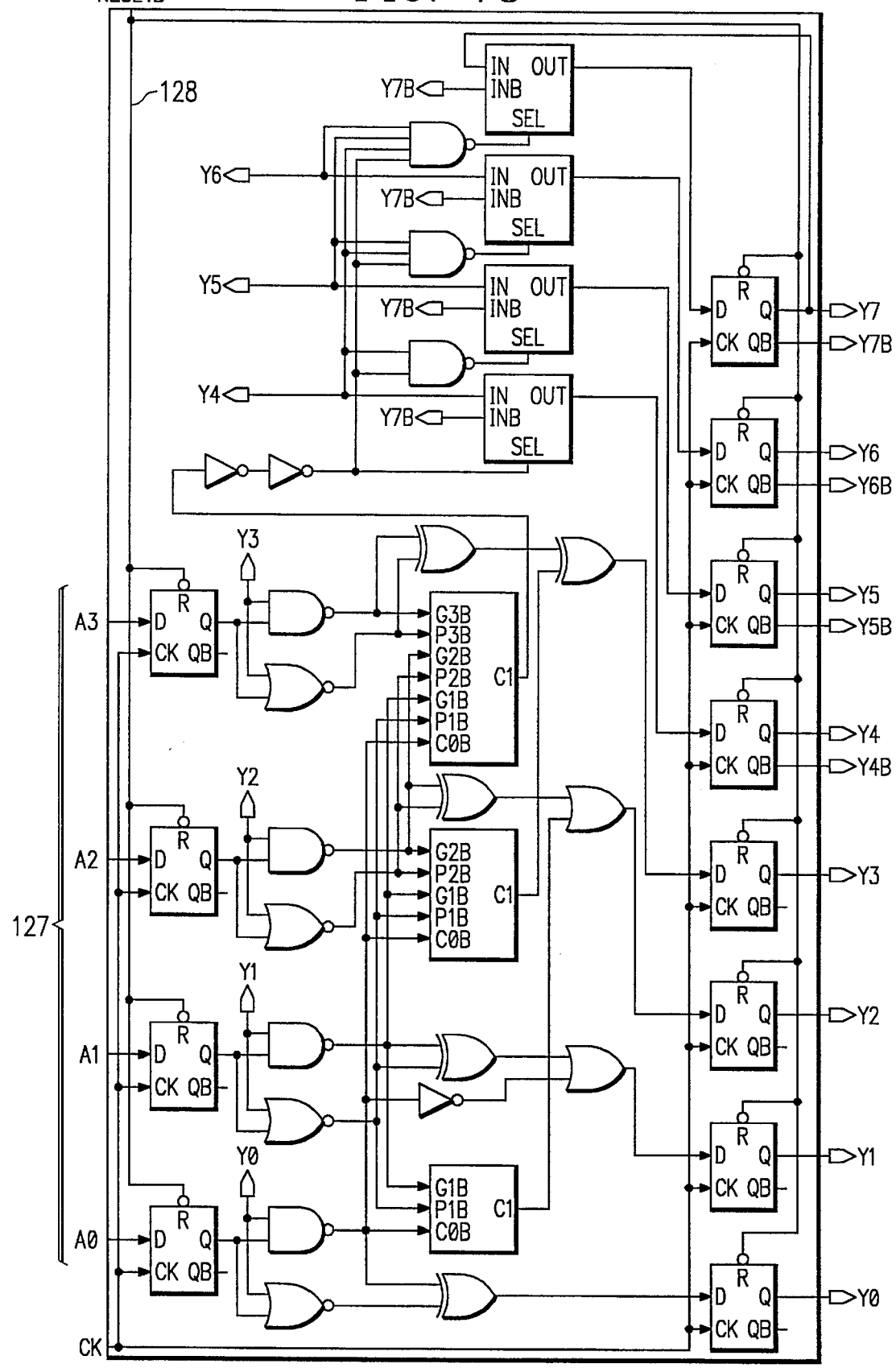
FIG. 13 is an electrical schematic diagram of the adder depicted in FIG. 5.

FIG. 13 is an electrical schematic diagram of adder 128. Adder 128 receives a stream of 4-bit words (A0–A1) on bus 127, each 4-bit word corresponding to the total number of ones of the current 8-bits of color data received from palette RAM 76. The 8-bit output representing the running sum of the data stream is provided on bus 129 to latches 150 for clocking out when the ones data for the entire screen has been accumulated, as flagged by the falling edge of the vertical synchronization signal (VSYNCO) for display 26.

FIG. 14 is an electrical schematic diagram of checksum multiplexer 130. Checksum multiplexer 130 receives the 8-bit total for the running sum of color data output from palette RAM 76 for the current display screen from adder 128 on bus 129. Checksum multiplexer 130 passes the 8-bit word on bus 129 to the test register 118 when one of the lines comprising bus 123 is set high. Test register 118 can then pass the results of the ones accumulation to processor 18. Processor 18 compares the total ones accumulation for the current display screen with an expected ones accumulation value to determine if an error exists.

While illustrated embodiments of the invention and their advantages have been set forth in the above-detailed description, the invention is not limited thereto, but only by the scope and spirit of the appended claims.

TABLE 1

APPENDIX

| INPUT VALUE | | | |
|---|---|---|---|
| D2 | D1 | D0 | TEST FUNCTION |
| 0 | 0 | 0 | COLOR PALLETTE RAM RED DATA ON BUS 96a COUPLED TO PROCESSOR 18 |
| 0 | 0 | 1 | COLOR PALETTE RAM GREEN DATA ON BUS 96b COUPLED TO PROCESSOR 18 |
| 0 | 1 | 0 | COLOR PALETTE RAM BLUE DATA ON BUS 96C COUPLED TO PROCESSOR 18 |
| 0 | 1 | 1 | READ IDENTIFICATION CODE |
| 1 | 0 | 0 | PERFORM ONES ACCUMULATION ON COLOR PALETTE RAM RED DATA ON BUS 96a |
| 1 | 0 | 1 | PERFORM ONES ACCUMULATION ON COLOR PALETTE RAM GREEN DATA ON BUS 96b |
| 1 | 1 | 0 | PERFORM ONES ACCUMULATION ON COLOR PALETTE RAM BLUE DATA ON BUS 96c |
| 1 | 1 | 1 | PERFORM DAC TEST |

TABLE II

| INPUT VALUE | | | | | OUTPUT BIT D3 = 1 | OUTPUT BIT D3 = 0 |
|---|---|---|---|---|---|---|
| D7 | D6 | D5 | D4 | TEST FUNCTION | (Latch 136d) | (Latch 136d) |
| 0 | 0 | 0 | 0 | NORMAL OPERATION (OUT OF TEST MODE | DON'T CARE | DON'T CARE |
| 1 | 0 | 1 | 0 | RED DAC VOLTAGE OUTPUT ON BUS 98a COMPARED WITH BLUE DAC VOLTAGE OUTPUT ON BUS 98c | RED > BLUE | RED < BLUE |
| 1 | 0 | 0 | 1 | RED DAC VOLTAGE OUTPUT ON BUS 98a COMPARED WITH REFERENCE VOLTAGE $V_{ref}$ | RED > $V_{ref}$ | RED < $V_{ref}$ |
| 0 | 1 | 1 | 0 | GREEN DAC VOLTAGE OUTPUT ON BUS 98b COMPARED WITH BLUE DAC VOLTAGE OUTPUT ON BUS 98c | GREEN > BLUE | GREEN < BLUE |
| 0 | 1 | 0 | 1 | GREEN DAC VOLTAGE OUTPUT ON BUS 98b COMPARED WITH REFERENCE VOLTAGE $V_{ref}$ | GREEN > $V_{ref}$ | GREEN < $V_{ref}$ |

What is claimed is:

1. Test circuitry comprising:
   a multiplexer for selectively receiving multiple bit control words defining test functions to be executed by said test circuitry and for outputting data from said test circuitry;
   a plurality of digital data inputs for receiving multiple bit words of digital data;
   a register coupled to said multiplexer for storing a one of said multiple bit control words received by said multiplexer;
   control circuitry coupled to said register for controlling execution of said test function defined by said one of said control words being held in said register;
   first test circuitry coupled to said digital data inputs, said multiplexer and said control circuitry for passing said digital data words received at said digital data inputs to said multiplexer for output in response to a first control word of said control words being stored in said register.

2. The test circuitry of claim 1 and further comprising:
   second test circuitry coupled to said plurality of digital inputs, said multiplexer and said control circuitry for determining the number of logic ones comprising said digital data words received at said digital data inputs and passing a result to said multiplexer for output in response to a second control word of said control words being stored in said register.

3. The test circuitry of claim 2 and further comprising:
   a plurality of analog data inputs for receiving analog data; and
   third test circuitry coupled to said plurality of analog data inputs, said multiplexer and said control circuitry for comparing selected first and second said analog data received at said plurality of analog inputs and passing a result to said multiplexer for output in response to a third control word of said control words being stored in said register.

4. The test circuitry of claim 3, and further comprising a second register coupled to said multiplexer, said control circuitry and said third test circuitry, for holding a data word received through said multiplexer, said data word defining the selection of said first and second ones of said analog data to be compared by said third test circuitry.

5. The test circuitry of claim 2, wherein said second test circuitry comprises:
   accumulator circuitry coupled to said plurality of data inputs for determining the number of logic ones comprising each said multiple bit data word of a plurality of said data words received at said data inputs; and
   adder circuitry for maintaining a running sum of said logic ones for said plurality of data words.

6. The test circuitry of claim 3, wherein said third test circuitry compares a voltage of said first analog data with a voltage of said second analog data.

7. The test circuitry of claim 6 and wherein said second analog data comprises a reference voltage.

8. The processor test circuitry of claim 7 and further comprising an analog test control register coupled to said control circuitry for holding an analog test control word, said control circuitry selecting said selected pair of analog data for comparison in response to said analog test control word.

9. The test circuitry of claim 1, wherein said control circuitry is further operable to increment said one of said control words being held in said register to automatically provide a new one of said control word upon the execution of the test function defined by said control word.

10. The test circuitry of claim 4, wherein said control circuitry is further operable to automatically execute a one of said test functions defined by said new control word.

11. Processor test circuitry comprising:
    a test multiplexer for selectively receiving multiple bit control words each defining a test function to be executed by said test circuitry and for selectively outputting resulting test data from said test circuitry;
    a plurality of parallel digital data inputs for receiving respective parallel multiple bit words of digital data;
    a plurality of parallel analog data inputs for receiving parallel analog data;
    a control register coupled to said multiplexer for holding a one of said multiple bit control words received from said multiplexer;
    control circuitry coupled to said control register for controlling execution of said test function defined by said control word being held in said register;
    data flow test circuitry coupled to said plurality of parallel digital data inputs, said multiplexer and said control circuitry, for passing a selected one of said parallel words of data received at said digital data inputs to said test multiplexer for output in response to a first control word of said control words being held in said register;
    first state machine circuitry coupled to said control register for incrementing said first control word to produce a second control word, said data flow test circuitry and said control circuitry passing another one of said parallel words of data received at said digital inputs to said test multiplexer in response to said second control word;
    one's accumulation circuitry for determining the number of logic ones comprising said data words received at said digital data inputs comprising:
    an accumulator multiplexer coupled to said plurality of parallel digital inputs and said control circuitry for passing a selected one of said parallel words of data received at said digital inputs in response to a third control word of said control words being held in said register;
    an accumulator coupled to said accumulator multiplexer for determining the number of logic ones comprising a said parallel word of data passed by said multiplexer;
    second state machine circuitry coupled to said control register for incrementing said third control word held in said register to produce a forth control word, said accumulator multiplexer and said control circuitry passing another one of said parallel words of data to said accumulator in response to said forth data word;
    an adder coupled to said accumulator for taking a running total of the number of logic ones determined for each said parallel word of data passed to said accumulator; and
    a checksum multiplexer coupled to said control circuitry for selectively passing said running total to said test multiplexer for output; and
    analog test circuitry coupled to said control circuitry and said plurality of analog data inputs for comparing the analog data appearing on a selected pair of said plurality of analog data inputs in response to a fifth control word of said control words being held in said control register.

12. The analog test circuitry of claim 11, wherein said accumulator comprises:
    first accumulator circuitry for determining the number of logic one's comprising a first portion of said parallel data word passed by said accumulator multiplexer;

second accumulator circuitry for determining the number of logic one's comprising a second portion of said parallel data word passed by said accumulator multiplexer; and an adder for summing the number of logic one's determined for said first and second portions to determine a total number of logic one's comprising said parallel data word passed by said accumulator multiplexer.

13. The processor test circuitry of claim 11, wherein said data flow test circuitry comprises a multiplexer having a plurality of inputs coupled to said digital data inputs and a plurality of outputs coupled to said test multiplexer.

14. The processor test circuitry of claim 11, wherein said analog test circuitry includes voltage comparator circuitry for comparing the voltages of the analog data appearing on said selected pair of said plurality of analog data inputs.

15. The processor test circuitry of claim 11, wherein said analog test circuitry is further operable to compare a voltage appearing on a selected one of said analog data inputs with a reference voltage.

16. The processor test circuitry of claim 11, wherein said test multiplexer comprises a plurality of one-bit multiplexers each operable to receive one bit of said multiple bit control word and output one bit of test of resulting test data.

17. The processor test circuitry of claim 16, wherein said control register comprises a plurality of latches each operable to latch a respective bit received by a corresponding one-bit multiplexer.

18. The processor test circuitry of claim 11 and further comprising a latch coupled to said analog test circuitry and said test multiplexer for latching a result of a comparison made by said analog test circuitry such that said result is available for output by said test multiplexer.

19. A test method comprising the steps of:

selectively receiving, through a multiplexer, multiple bit control words defining test functions to be executed;

storing one of said multiple bit words in a register;

receiving a plurality of multiple bit words of digital data at a corresponding plurality of digital data input;

in response to a first control word being stored in the register, coupling the digital data inputs to the multiplexer such that the digital words are passed from the digital data inputs to the multiplexer and output; and in response to a second one of the multiple bit control words being stored in the register, determining the number of logic ones comprising the digital data words received at the digital data inputs and passing the result to the multiplexer for output.

20. The method of claim 19 and further comprising the steps of:

receiving analog data at a plurality of analog data inputs; and in response to a third multiple bit control word being stored in the register, comparing the voltages of first and second ones of the analog data received at the plurality of analog inputs and passing a result to the multiplexer for output.

* * * * *